United States Patent
Hiyoshi et al.

(10) Patent No.: US 9,224,802 B2
(45) Date of Patent: Dec. 29, 2015

(54) SILICON CARBIDE SEMICONDUCTOR DEVICE AND METHOD FOR MANUFACTURING SAME

(71) Applicant: Sumitomo Electric Industries, Ltd., Osaka (JP)

(72) Inventors: Toru Hiyoshi, Osaka (JP); Keiji Wada, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/439,612

(22) PCT Filed: Oct. 21, 2013

(86) PCT No.: PCT/JP2013/078482
§ 371 (c)(1),
(2) Date: Apr. 29, 2015

(87) PCT Pub. No.: WO2014/083969
PCT Pub. Date: Jun. 5, 2014

(65) Prior Publication Data
US 2015/0279926 A1   Oct. 1, 2015

(30) Foreign Application Priority Data

Nov. 29, 2012   (JP) .................................. 2012-261341

(51) Int. Cl.
*H01L 29/15* (2006.01)
*H01L 29/04* (2006.01)
(Continued)

(52) U.S. Cl.
CPC ............ *H01L 29/04* (2013.01); *H01L 29/1608* (2013.01); *H01L 29/36* (2013.01); *H01L 29/66068* (2013.01); *H01L 29/7827* (2013.01)

(58) Field of Classification Search
CPC ...................... H01L 29/66068; H01L 29/7811; H01L 29/7813; H01L 29/045; H01L 29/3065; H01L 29/0657; H01L 29/0661; H01L 29/868; H01L 29/4236; H01L 29/6606; H01L 29/7397

USPC ............................................ 257/77; 438/198
See application file for complete search history.

(56) References Cited

U.S. PATENT DOCUMENTS

| 6,054,752 A | 4/2000 | Hara et al. |
| 2007/0057262 A1* | 3/2007 | Nakamura et al. ..... H01L 21/046 257/77 |

(Continued)

FOREIGN PATENT DOCUMENTS

| JP | 11-74524 A | 3/1999 |
| JP | 2007-258465 A | 10/2007 |

(Continued)

OTHER PUBLICATIONS

Hino et al., "SiC-MOSFET structure enabling fast turn-on-and -off switching", Material Science Forum, vols. 717-720 (2012), pp. 1097-1100.

(Continued)

*Primary Examiner* — Trung Q Dang
(74) *Attorney, Agent, or Firm* — Venable LLP; Michael A. Sartori

(57) ABSTRACT

Each of first to third impurity regions of a silicon carbide substrate has a portion located on a flat surface of a first main surface. On the flat surface, a gate insulating film connects the first and third impurity regions to each other. On the flat surface, a first main electrode is in contact with the third impurity region. A second main electrode is provided on a second main surface. A side wall insulating film covers a side wall surface of the first main surface. The side wall surface is inclined by not less than 50° and not more than 80° relative to a {000-1} plane. In this way, a leakage current is suppressed in a silicon carbide semiconductor device.

9 Claims, 16 Drawing Sheets

(51) Int. Cl.
*H01L 29/16* (2006.01)
*H01L 29/66* (2006.01)
*H01L 29/36* (2006.01)
*H01L 29/78* (2006.01)

(56) References Cited

U.S. PATENT DOCUMENTS

| | | |
|---|---|---|
| 2009/0200559 A1 | 8/2009 | Suzuki et al. |
| 2012/0228640 A1* | 9/2012 | Masuda et al. ........ H01L 29/045 257/77 |
| 2013/0001703 A1* | 1/2013 | Sugawara ........... H01L 29/0661 257/378 |
| 2013/0130482 A1* | 5/2013 | Masuda et al. ...... H01L 438/507 438/507 |
| 2013/0193447 A1* | 8/2013 | Shimazu; Mitsuru ............. H01L 29/1608 257/77 |
| 2013/0214291 A1 | 8/2013 | Uchida et al. |
| 2013/0285071 A1 | 10/2013 | Kameshiro et al. |
| 2013/0341648 A1* | 12/2013 | Saitoh; Yu ........... H01L 29/1608 257/77 |

FOREIGN PATENT DOCUMENTS

| | | |
|---|---|---|
| JP | 2007-258742 A | 10/2007 |
| JP | 2010-147222 A | 7/2010 |
| JP | 2010-225615 A | 10/2010 |
| JP | 2012-038771 A | 2/2012 |
| WO | WO-2012/056705 A1 | 5/2012 |
| WO | WO-2012/063310 A1 | 5/2012 |

OTHER PUBLICATIONS

International Search Report issued in Application No. PCT/JP2013/078482 dated Nov. 19, 2013.
Notice of Grounds of Rejection in Japanese Patent Application No. 2012-261341, dated Oct. 6, 2015.

* cited by examiner

SILICON CARBIDE SEMICONDUCTOR DEVICE AND METHOD FOR MANUFACTURING SAME

TECHNICAL FIELD

The present invention relates to a silicon carbide semiconductor device and a method for manufacturing the silicon carbide semiconductor device.

BACKGROUND ART

In order to increase the breakdown voltage of a vertical type semiconductor device, a termination structure can be used to relax an electric field. As such a termination structure, a JTE (Junction Termination Extension), a FLR (Field limiting Ring) (also referred to as "guard ring"), and the like have been known. For example, according to Shiro Hino et al., "SiC-MOSFET structure enabling fast turn-on and -off switching". Material Science Forum. Vols 717-720 (2012), pp 1097-1100 (Non-Patent Document 1), in an n channel double implantation MOSFET (Metal Oxide Semiconductor Field Effect Transistor), an outer circumferential p well is provided in a silicon carbide substrate. The outer circumferential p well is covered with a field oxide film (insulating film).

CITATION LIST

Non Patent Document

NPD 1: Shiro Hino et al., "SiC-MOSFET structure enabling fast turn-on and -off switching", Material Science Forum. Vols. 717-720 (2012), pp. 1097-1100

SUMMARY OF INVENTION

Technical Problem

As described above, in the termination structure, an interface is formed between the silicon carbide substrate and the insulating film. As a current is more likely to flow along this interface, a leakage current of the silicon carbide semiconductor device becomes larger Hence, a demand arises in a termination structure capable of reducing such a leakage current.

The present invention has been made to solve the problem described above, and has an object to provide a silicon carbide semiconductor device capable of suppressing a leakage current as well as a method for manufacturing such a silicon carbide semiconductor device.

Solution to Problem

A silicon carbide semiconductor device according to one aspect of the present invention has an element portion provided with a semiconductor element, and a termination portion surrounding the element portion. The silicon carbide semiconductor device includes a silicon carbide substrate, a gate insulating film, a gate electrode, a first main electrode, a second main electrode, and a side wall insulating film. The silicon carbide substrate is made of silicon carbide having a hexagonal single-crystal structure. The silicon carbide substrate has a first main surface and a second main surface opposite to the first main surface. The first main surface has a flat surface and a side wall surface, the flat surface being located in the element portion, the side wall surface being located in the termination portion, the side wall surface surrounding the flat surface, the side wall surface being inclined relative to the flat surface so as to come close to the second main surface. The silicon carbide substrate includes a first impurity region, a second impurity region, and a third impurity region, the first impurity region having a first conductivity type, the second impurity region being provided on the first impurity region and having a second conductivity type, the third impurity region being provided on the second impurity region and being separated from the first impurity region by the second impurity region. Each of the first to third impurity regions has a portion located on the flat surface. The gate insulating film connects the first and third impurity regions to each other on the flat surface of the first main surface. The gate electrode is provided on the gate insulating film. The first main electrode is in contact with the third impurity region on the flat surface of the first main surface. The second main electrode is provided on the second main surface. The side wall insulating film covers the side wall surface of the first main surface. The side wall surface is inclined by not less than 50° and not more than 80° relative to a $\{000\text{-}1\}$ plane.

In accordance with the silicon carbide semiconductor device according to the above-described one aspect, the side wall surface disposed in the termination portion is inclined by not less than 50° and not more than 80° relative to the $\{000\text{-}1\}$ plane. Accordingly, in the termination portion, an interface state density in the interface between the side wall surface of the silicon carbide substrate and the side wall insulating film can be made low, his suppresses generation of electric current resulting from existence of the interface state. Therefore, the leakage current of the silicon carbide semiconductor device can be suppressed.

Preferably, the side wall surface of the first main surface of the silicon carbide substrate includes a first plane having a plane orientation of $\{0\text{-}33\text{-}8\}$. More preferably, the side wall surface of the first main surface of the silicon carbide substrate microscopically includes the first plane, and the side wall surface microscopically further includes a second plane having a plane orientation of $\{0\text{-}11\text{-}1\}$. More preferably, the first and second planes of the side wall surface of the first main surface of the silicon carbide substrate form a combined plane having a plane orientation of $\{0\text{-}11\text{-}2\}$. Accordingly, the leakage current of the silicon carbide semiconductor device can be suppressed more securely.

A silicon carbide semiconductor device according to another aspect of the present invention has an element portion provided with a semiconductor element, and a termination portion surrounding the element portion. The silicon carbide semiconductor device includes a silicon carbide substrate, a gate insulating film, a gate electrode, a first main electrode, a second main electrode, and a side wall insulating film. The silicon carbide substrate is made of silicon carbide having a hexagonal single-crystal structure. The silicon carbide substrate has a first main surface and a second main surface opposite to the first main surface. The first main surface has a flat surface and a side wall surface, the flat surface being located in the element portion, the side wall surface being located in the termination portion, the side wall surface surrounding the flat surface, the side wall surface being inclined relative to the flat surface so as to come close to the second main surface. The silicon carbide substrate includes a first impurity region, a second impurity region, and a third impurity region, the first impurity region having a first conductivity type, the second impurity region being provided on the first impurity region and having a second conductivity type, the third impurity region being provided on the second impurity region and being separated from the first impurity region by the second impurity region. Each of the first to third impurity regions has a portion located on the flat surface. The gate insulating film connects the first and third impurity regions to each other on the flat surface of the first main surface. The gate electrode is provided on the gate insulating film. The first main electrode is in contact with the third impurity region on the flat surface of the first main surface. The second main electrode is provided on the second main surface. The side wall insulating film covers the side wall surface of the first main surface. The side wall surface has one of plane orientations of {0-33-8}, {0-11-2}, {0-11-4} and {0-11-1} when viewed macroscopically.

In accordance with the silicon carbide semiconductor device according to the above-described another aspect, the side wall surface disposed in the termination portion has one of plane orientations of {0-33-8}, {0-11-2}, {0-11-4} and {0-11-1} when viewed macroscopically. Accordingly, in the termination portion, an interface state density in the interface between the side wall surface of the silicon carbide substrate and the side wall insulating film can be made low. This suppresses generation of electric current resulting from existence of the interface state. Therefore, the leakage current of the silicon carbide semiconductor device can be suppressed.

Preferably, a side wall impurity region is provided at the side wall surface of the first main surface of the silicon carbide substrate, the side wall impurity region having the second conductivity type and being connected to the third impurity region. Accordingly, electric field concentration is relaxed, thereby increasing the breakdown voltage of the silicon carbide semiconductor device.

Preferably, the first main surface of the silicon carbide substrate has a bottom surface surrounding the side wall surface in the termination portion, and the bottom surface has a smaller inclination relative to the flat surface than an inclination of the side wall surface relative to the flat surface. Hence, the bottom surface of the termination portion can be provided with the structure for relaxing the electric field concentration.

Preferably, a guard ring region is provided at the bottom surface of the first main surface of the silicon carbide substrate, the guard ring region having the second conductivity type, the guard ring region being separated from the side wall surface, the guard ring region surrounding the side wall surface. Accordingly, electric field concentration is relaxed, thereby increasing the breakdown voltage of the silicon carbide semiconductor device.

A method for manufacturing a silicon carbide semiconductor device in the present invention is a method for manufacturing a silicon carbide semiconductor device having an element portion provided with a semiconductor element, and a termination portion surrounding the element portion, and includes the following steps. There is prepared a silicon carbide substrate made of silicon carbide having a hexagonal single-crystal structure. The silicon carbide substrate has a first main surface and a second main surface opposite to the first main surface. The first main surface has a flat surface and a side wall surface, the flat surface being located in the element portion, the side wall surface being located in the termination portion, the side wall surface surrounding the flat surface, the side wall surface being inclined relative to the flat surface so as to come close to the second main surface. The silicon carbide substrate includes a first impurity region, a second impurity region, and a third impurity region, the first impurity region having a first conductivity type, the second impurity region being provided on the first impurity region and having a second conductivity type, the third impurity region being provided on the second impurity region and being separated from the first impurity region by the second impurity region. Each of the first to third impurity regions has a portion located on the flat surface. The step of preparing the silicon carbide substrate includes the step of forming the side wall surface by removing a portion of the first main surface of the silicon carbide substrate through etching by heating the silicon carbide substrate while exposing a portion of the first main surface of the silicon carbide substrate to a gas containing a halogen element. There is formed a gate insulating film connecting the first impurity region and the third impurity region to each other on the flat surface of the first main surface There is formed a side wall insulating film covering the side wall surface of the first main surface. A gate electrode is formed on the gate insulating film. A first main electrode is formed in contact with the third impurity region on the flat surface of the first main surface. A second main electrode is formed on the second main surface.

According to the manufacturing method described above, the side wall surface is formed by the thermal etching. By using the thermal etching, the plane orientation of the side wall surface can become suitable for suppression of interface state between the side wall surface and the side wall insulating film. This suppresses generation of electric current resulting from existence of the interface state. Therefore, the leakage current of the silicon carbide semiconductor device can be suppressed.

Advantageous Effects of Invention

According to the present invention, the leakage current of the silicon carbide semiconductor device can be suppressed as described above.

DESCRIPTION OF EMBODIMENTS

Figure 1:
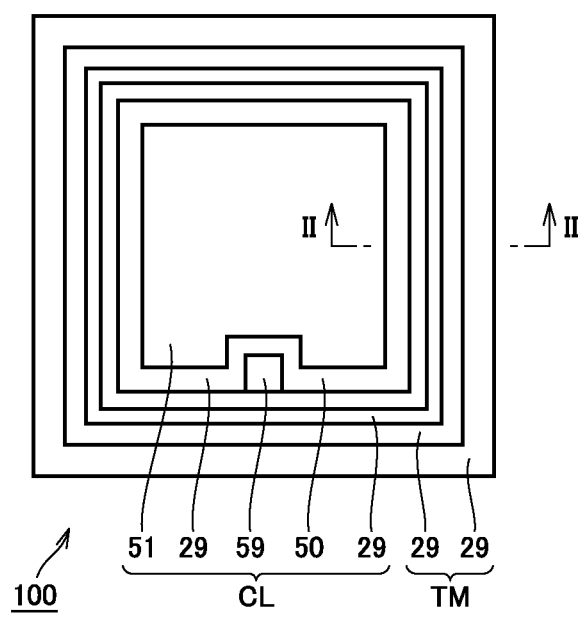
FIG. 1 is a plan view schematically showing a configuration of a silicon carbide semiconductor device in one embodiment of the present invention.

The following describes an embodiment of the present invention with reference to figures. It should be noted that in the below-mentioned figures, the same or corresponding portions are given the same reference characters and are not described repeatedly Regarding crystallographic indications of the present specification, an individual plane is represented by ( ), and a group plane is represented by { }. Further, in order to indicate that a plane has a negative index, instead of putting "–" (bar) above a numeral, a negative sign is put before the numeral.

(Configuration of Silicon Carbide Semiconductor Device)

Figure 2:
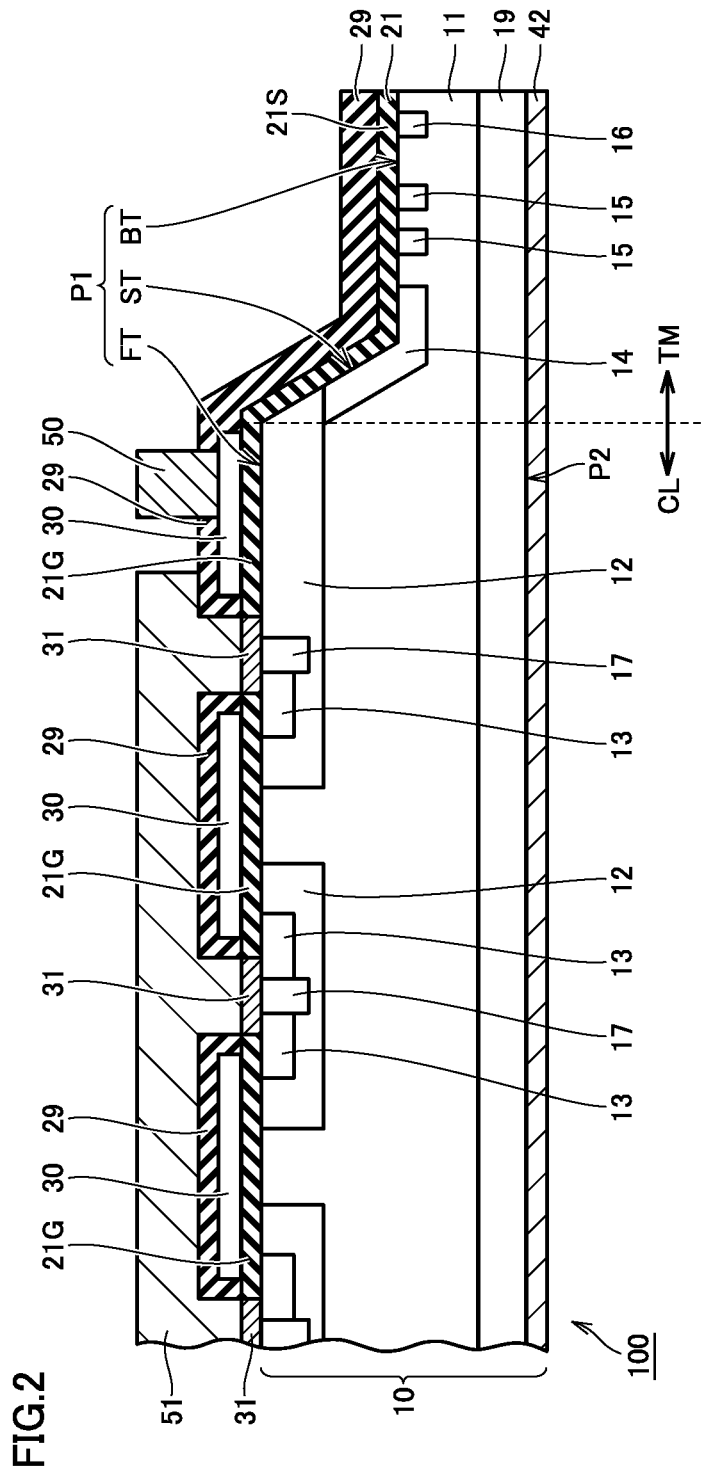
FIG. 2 is a partial schematic cross sectional view taken along a line II-II in FIG. 1.

As shown in FIG. 1 and FIG. 2, a MOSFET 100 (silicon carbide semiconductor device) includes: an element portion CL provided with a transistor element (semiconductor element), and a termination portion TM surrounding element portion CL. MOSFET 100 includes an epitaxial substrate 10 (silicon carbide substrate), an insulating film 21, an interlayer insulating film 29, a gate electrode 30, a source electrode 31 (first main electrode), a drain electrode 42 (second main electrode), a gate runner 50, an interconnection layer 51, and a gate pad 59.

Epitaxial substrate 10 is made of silicon carbide having a hexagonal single-crystal structure. The single-crystal structure preferably has polytype 4H Epitaxial substrate 10 has an upper surface P1 (first main surface) and a backside surface P2 (second main surface opposite to the first main surface). Upper surface P1 has a flat surface FT, a side wall surface ST, and a bottom surface BT. Flat surface FT is located in element portion CL. Side wall surface ST and bottom surface BT are located in termination portion TM. Side wall surface ST surrounds flat surface FT and is inclined relative to flat surface FT so as to come close to backside surface P2 Bottom surface BT surrounds side wall surface ST in termination portion TM Bottom surface BT has a smaller inclination relative to flat surface FT than the inclination of side wall surface ST relative to flat surface FT. Here, the "smaller inclination" represents a concept including a case where there is no inclination, i.e., a concept including parallelism. Therefore, bottom surface BT may be substantially in parallel with flat surface FT as shown in FIG. 2.

Flat surface FT of upper surface P1 is preferably substantially in parallel with a {000-1}plane. Specifically, the inclination of flat surface FT relative to the {000-1} plane is preferably not more than 10°, more preferably, not more than 5°.

Side wall surface ST of upper surface P1 is inclined by not less than 50° and not more than 80° relative to the {000-1} plane.

Side wall surface ST of upper surface P1 may have one of plane orientations of {0-33-8}, {0-11-2}, {0-11-4} and {0-11-1} when viewed macroscopically. It should be noted that the plane orientation of {0-33-8} has an off angle of 54.7° relative to the {000-1}plane. The plane orientation of {0-11-1} has an off angle of 75.1 relative to the {000-1}plane. Therefore, the plane orientations of {0-33-8}. {0-11-2}. {0-11-4}, and {0-11-1} correspond to off angles of 54.7° to 75.1°. In view of such a fact that there is considered a production error of about 5° with regard to the off angle, a process is performed to incline side wall surface ST of upper surface P1 by about not less than 50° and not more than 80° relative to the {000-1} plane, whereby the macroscopic plane orientation of side wall surface ST is likely to correspond to one of {0-33-8}, {0-11-2}. {0-11-4} and {0-11-1}.

Side wall surface ST as described above is readily provided with a "special plane". Details of the special plane will be described later.

Epitaxial substrate 10 includes a single-crystal substrate 19, an n drift region 11 (first impurity region), a p body region 12 (second impurity region), an n source region 13 (third impurity region), a JTE region 14 (side wall impurity region), a guard ring region 15, a field stop region 16, and a p contact region 17.

Single-crystal substrate 19 has n type conductivity. N drift region 11 has n type conductivity (first conductivity type) P body region 12 is provided on n drift region 11, and has p type conductivity (second conductivity type different from the first conductivity type). N source region 13 is provided on body region 12, and is separated from n drift region 11 by p body region 12. Each of n drift region 11, p body region 12, n source region 13, and p contact region 17 has a portion located on flat surface FT of upper surface P1. P contact region 17 is connected to p body region 12. P contact region 17 has an impurity concentration higher than the impurity concentration of p body region 12.

JTE region 14 has p type conductivity JTE region 14 is provided at side wall surface ST of upper surface P1, and is connected to p body region 12 JTE region 14 has an impurity concentration lower than the impurity concentration of p body region 12. Guard ring region 15 has p type conductivity Guard ring region 15 is provided at bottom surface BT of upper surface P1 of epitaxial substrate 10, is separated from side wall surface ST, and surrounds side wall surface ST. Field stop region 16 has n type conductivity and has an impurity concentration higher than the impurity concentration of n drift region 11. Field stop region 16 surrounds side wall surface ST.

Insulating film 21 has a gate insulating film 21G and a side wall insulating film 21S. On flat surface FT of upper surface P1, gate insulating film 21G connects n drift region 11 and n source region 13 to each other. Accordingly, a channel surface is formed on flat surface FT. Side wall insulating film 21S covers side wall surface ST and bottom surface BT of upper surface P1.

Gate electrode 30 is provided on gate insulating film 21G. Gate runner 50 and gate pad 59 (FIG. 1) are provided on gate electrode 30, and are made of a conductor. Source electrode 31 is an ohmic electrode in contact with n source region 13 and p contact region 17 on flat surface FT of upper surface P1. Interconnection layer 51 is provided on source electrode 31 and interlayer insulating film 29. Drain electrode 42 is an ohmic electrode provided on backside surface P2. Gate runner 50 is configured to suppress an electric potential difference in gate electrode 30.

Figure 3:
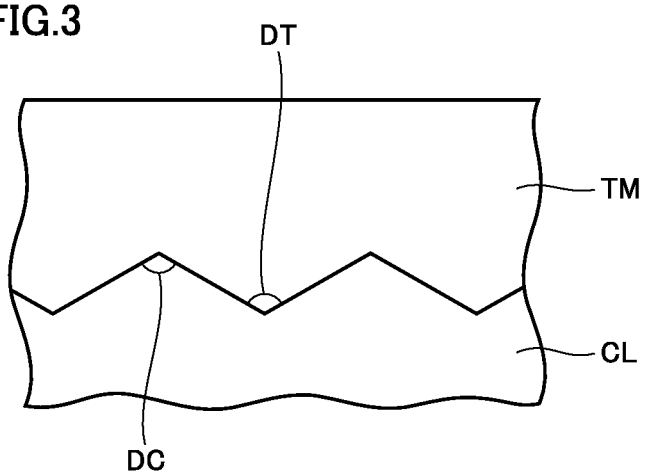
FIG. 3 is a partial enlarged view of FIG. 1.
Figure 4:
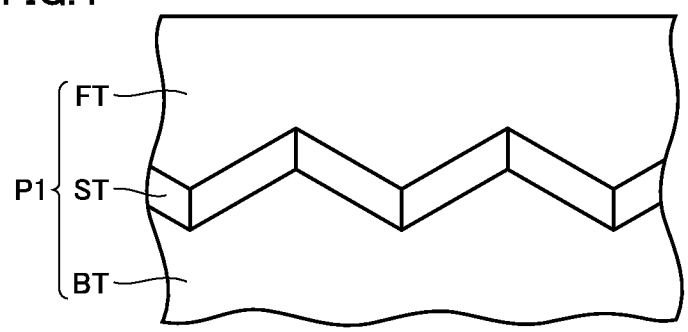
FIG. 4 is a plan view of a silicon carbide substrate corresponding to a field of view of FIG. 3.

As shown in FIG. 3, when viewed in a plan view, a boundary between element portion CL and termination portion TM may include a zigzag configuration. In this zigzag configuration, an angle DC of a portion projecting from element portion CL to termination portion TM is preferably 60°. Moreover, in this zigzag configuration, an angle DT of a portion projecting from termination portion TM to element portion CL is preferably 60°. 60° is preferable because epitaxial substrate 10 has a hexagonal crystal structure, which has six-fold symmetry. As shown in FIG. 4, side wall surface ST is preferably disposed along the zigzag configuration, and bottom surface BT is provided adjacent to side wall surface ST in this zigzag configuration.

(Method for Manufacturing Silicon Carbide Semiconductor Device)

Next, a method for manufacturing MOSFET 100 (FIG. 2) will be illustrated.

Figure 5:
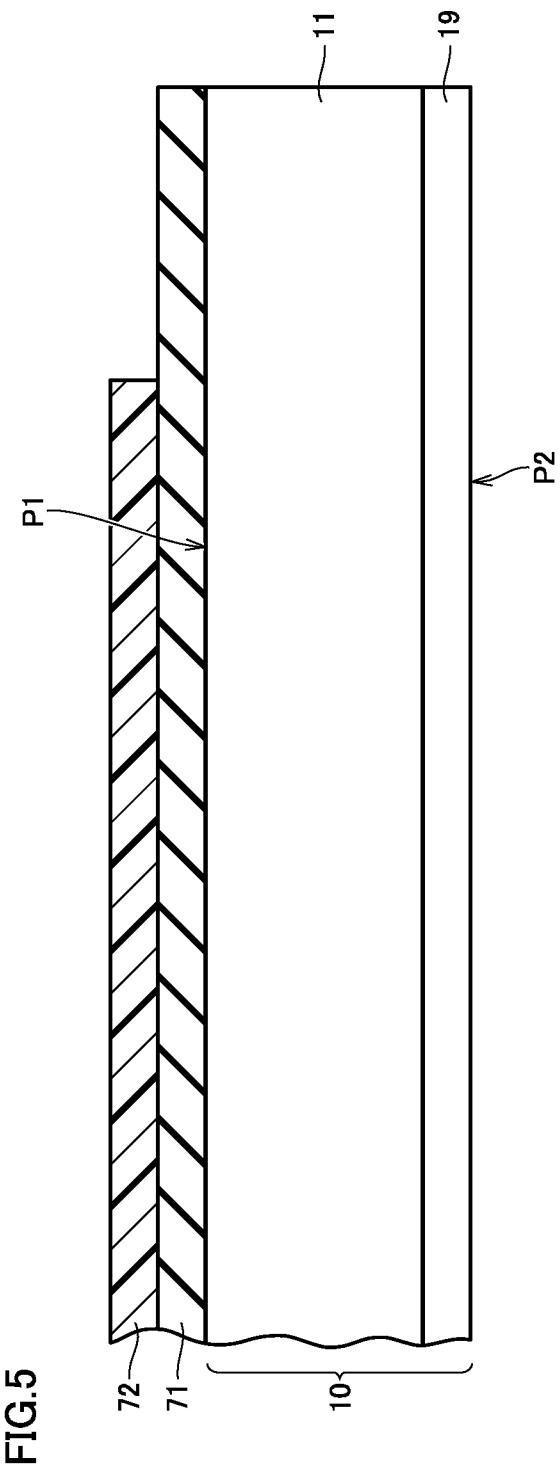
FIG. 5 is a partial cross sectional view schematically showing a first step or a method for manufacturing the silicon carbide semiconductor device of FIG. 2.

With reference to FIG. 5, n drift region 11 to constitute upper surface P1 is formed through epitaxial growth of silicon carbide on single-crystal substrate 19. Accordingly, epitaxial substrate 10 having single-crystal substrate 19 and n drill region 11 is formed. The epitaxial growth can be performed by means of a CVD (Chemical Vapor Deposition) method. On this occasion, hydrogen gas can be used as a carrier gas. As a source material gas, a mixed gas of silane ($SiH_4$) and propane ($C_3H_8$) can be used, for example. In doing so, it is preferable to introduce nitrogen (N) or phosphorus (P) as an impurity for providing silicon carbide with n type conductivity, for example.

Figure 6:
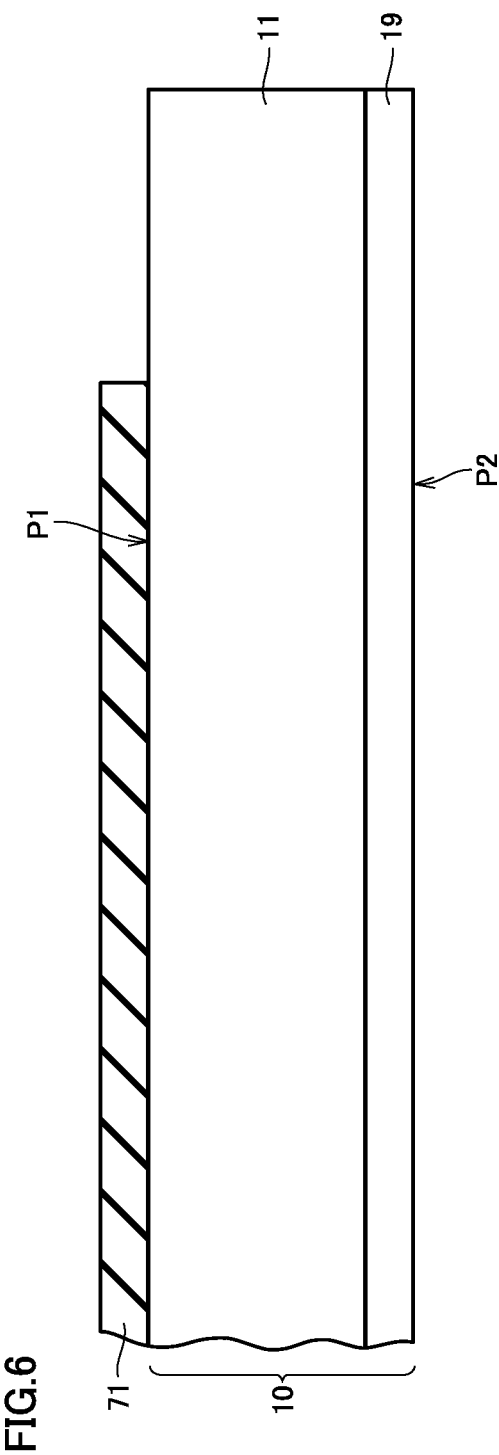
FIG. 6 is a partial cross sectional view schematically showing a second step of the method for manufacturing the silicon carbide semiconductor device of FIG. 2.

Next, a mask layer 71 is formed on upper surface P1. Preferably, mask layer 71 is a thermal oxidation film Formed on upper surface P1 of epitaxial substrate 10. Next, a photoresist layer 72 having a pattern is formed on mask layer 71. With etching using photoresist layer 72, this pattern is transferred to mask layer 71 (FIG. 6).

Figure 7:
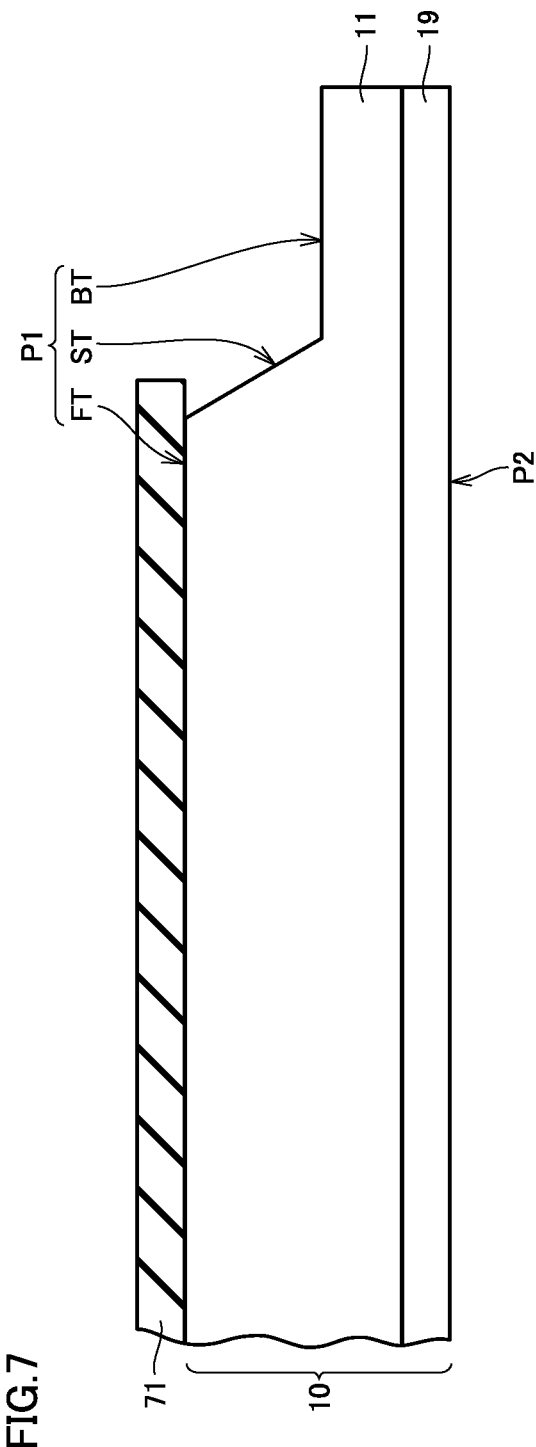
FIG. 7 is a partial cross sectional view schematically showing a third step of the method for manufacturing the silicon carbide semiconductor device of FIG. 2.
Figure 8:
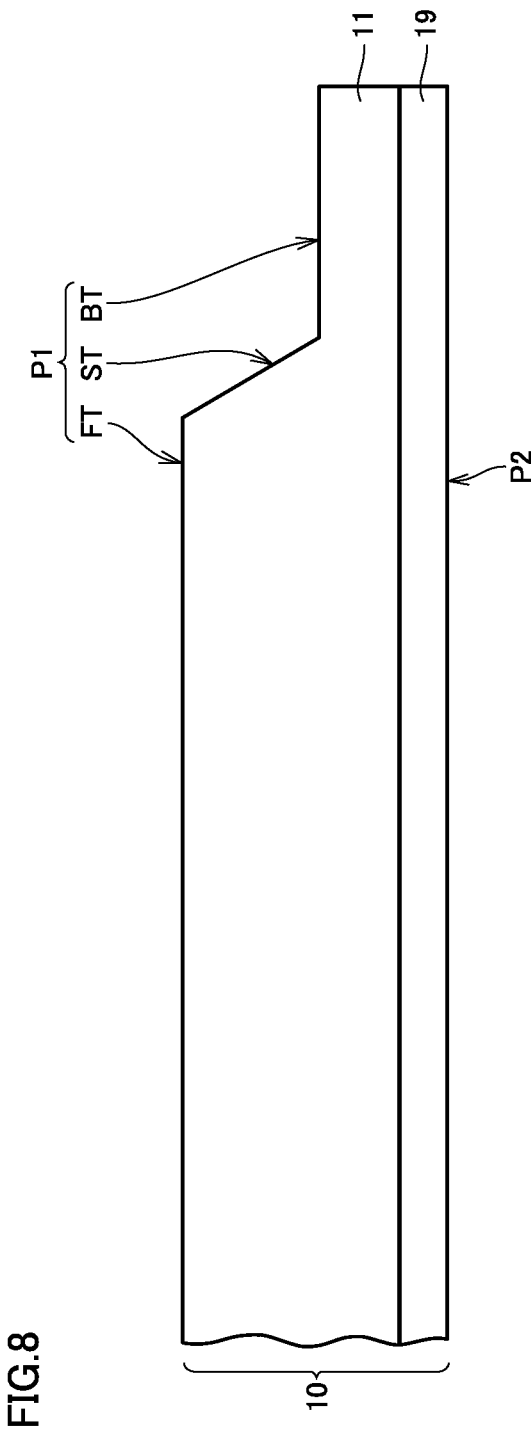
FIG. 8 is a partial cross sectional view schematically showing a fourth step of the method for manufacturing the silicon carbide semiconductor device of FIG. 2.

As shown in FIG. 7, on upper surface P1, thermal etching is performed using mask layer 71. Specifically, a portion of upper surface P1 of epitaxial substrate 10 is removed through etching by heating epitaxial substrate 10 while exposing a portion of upper surface P1 of epitaxial substrate 10 to a gas containing a halogen element. Accordingly, side wall surface ST and bottom surface BT are formed at upper surface P1 of epitaxial substrate 10. By using such thermal etching, the special plane is spontaneously formed in side wall surface ST. Details of the thermal etching will be described later Next, mask layer 71 is removed (FIG. 8).

Figure 9:
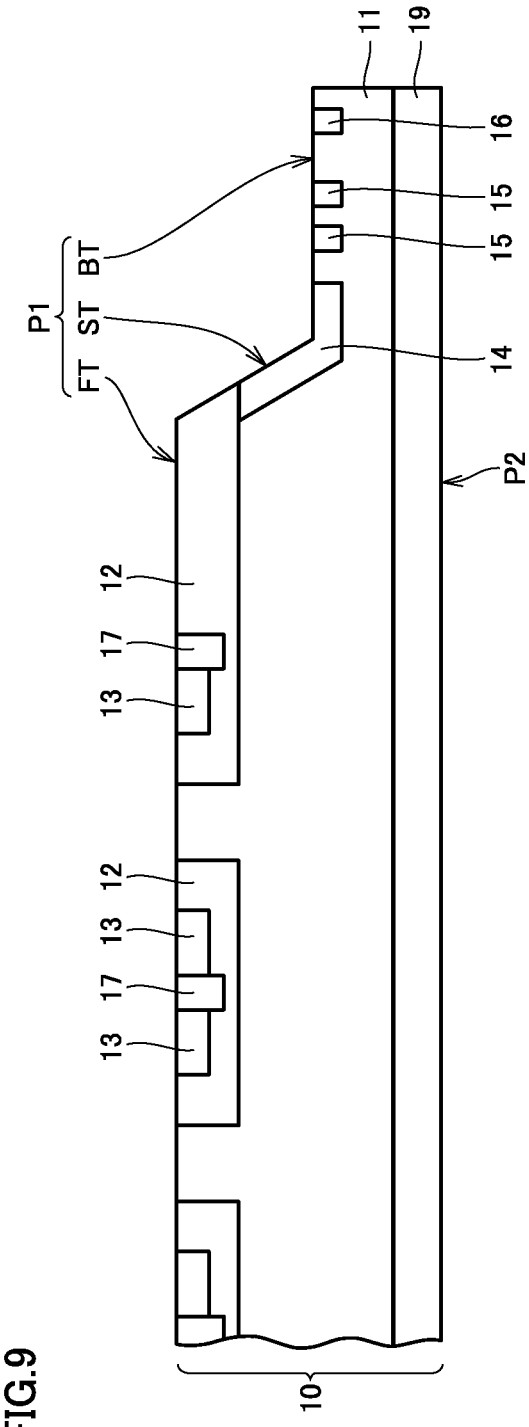
FIG. 9 is a partial cross sectional view schematically showing a fifth step of the method for manufacturing the silicon carbide semiconductor device of FIG. 2.

As shown in FIG. 9, p body region 12, n source region 13. JTE region 14, guard ring region 15, field stop region 16, and p contact region 17 are formed by ion implantation of conductive impurities. Next, an activation heat treatment is performed to activate the impurities. For example, heating is performed for 30 minutes at a temperature of approximately 1700° C. in an argon (Ar) atmosphere.

Figure 10:
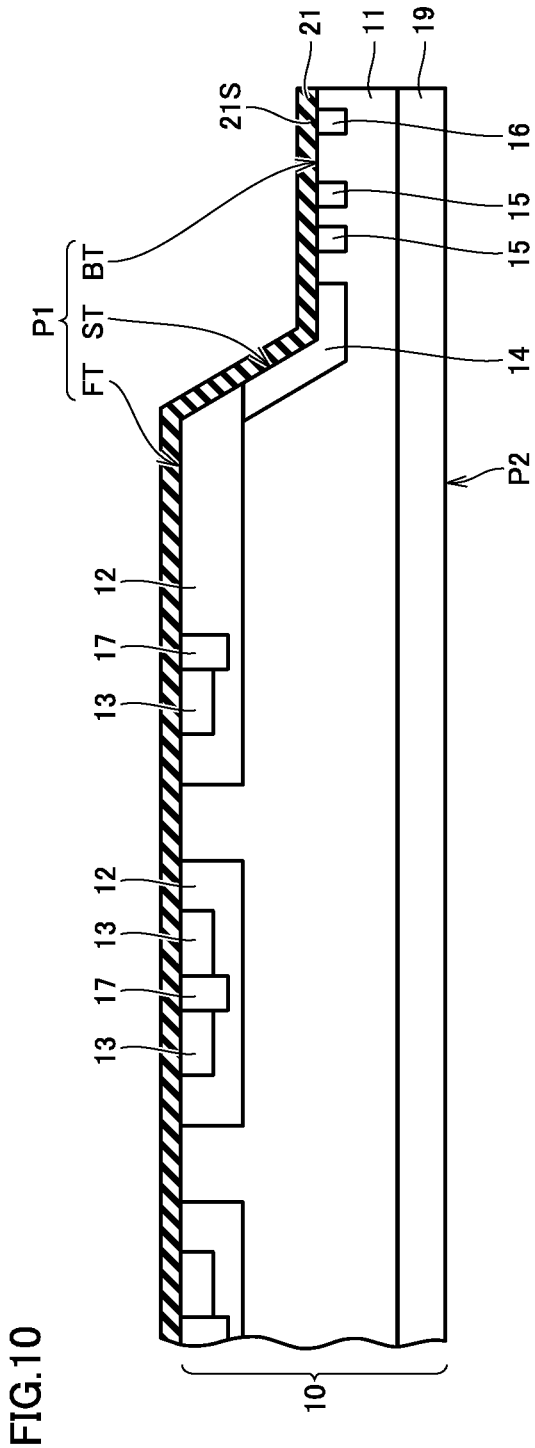
FIG. 10 is a partial cross sectional view schematically showing a sixth step of the method for manufacturing the silicon carbide semiconductor device of FIG. 2.

As shown in FIG. 10, through the thermal oxidation of upper surface P1 of epitaxial substrate 10, insulating film 21 is formed Insulating film 21 includes a portion to serve as gate insulating film 21G; and a portion to serve as side wall insulating film 21S. The thermal oxidation is performed by heating epitaxial substrate 10 for approximately 30 minutes at a temperature of approximately 1200° C. in air or oxygen, for example.

Next, nitrogen annealing is performed. Accordingly, the nitrogen concentration is adjusted to have a maximum value of about $1 \times 10^{21}/cm^3$ or greater in a region within 10 nm from an interface between epitaxial substrate 10 and insulating film 21. For example, in an atmosphere of gas containing nitrogen, such as nitrogen monoxide gas, heating is performed at a temperature of approximately 1100° C. for approximately 120 minutes. After this nitrogen annealing treatment, an annealing treatment may be performed additionally in an inert gas atmosphere. For example, in an argon atmosphere, heating is performed at a temperature of approximately 1100° C. for approximately 60 minutes. Accordingly, high channel mobility can be attained with good reproducibility.

Figure 11:
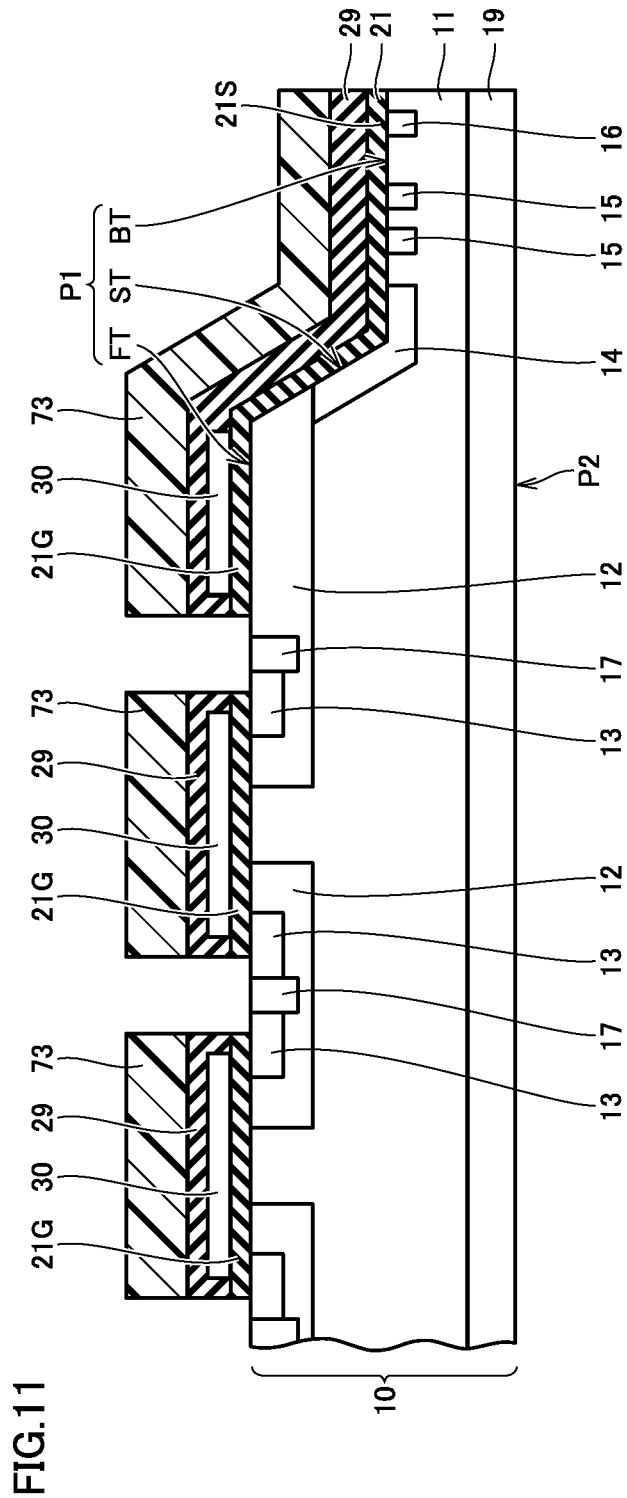
FIG. 11 is a partial cross sectional view schematically showing a seventh step of the method for manufacturing the silicon carbide semiconductor device of FIG. 2.
Figure 12:
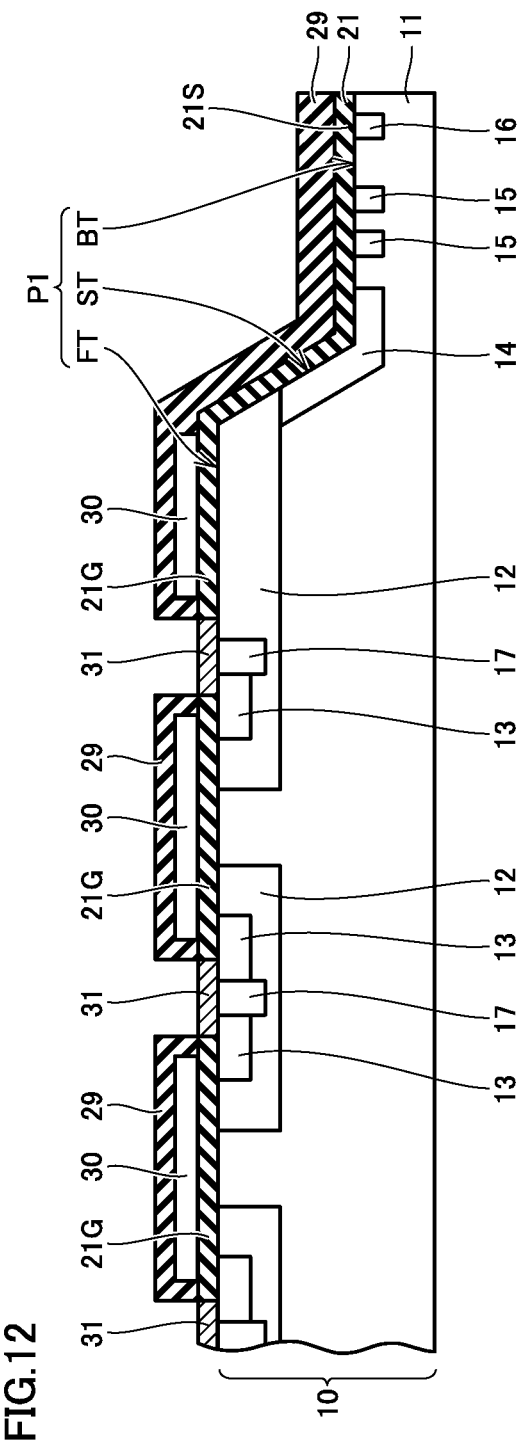
FIG. 12 is a partial cross sectional view schematically showing an eighth step of the method for manufacturing the silicon carbide semiconductor device of FIG. 2.
Figure 13:
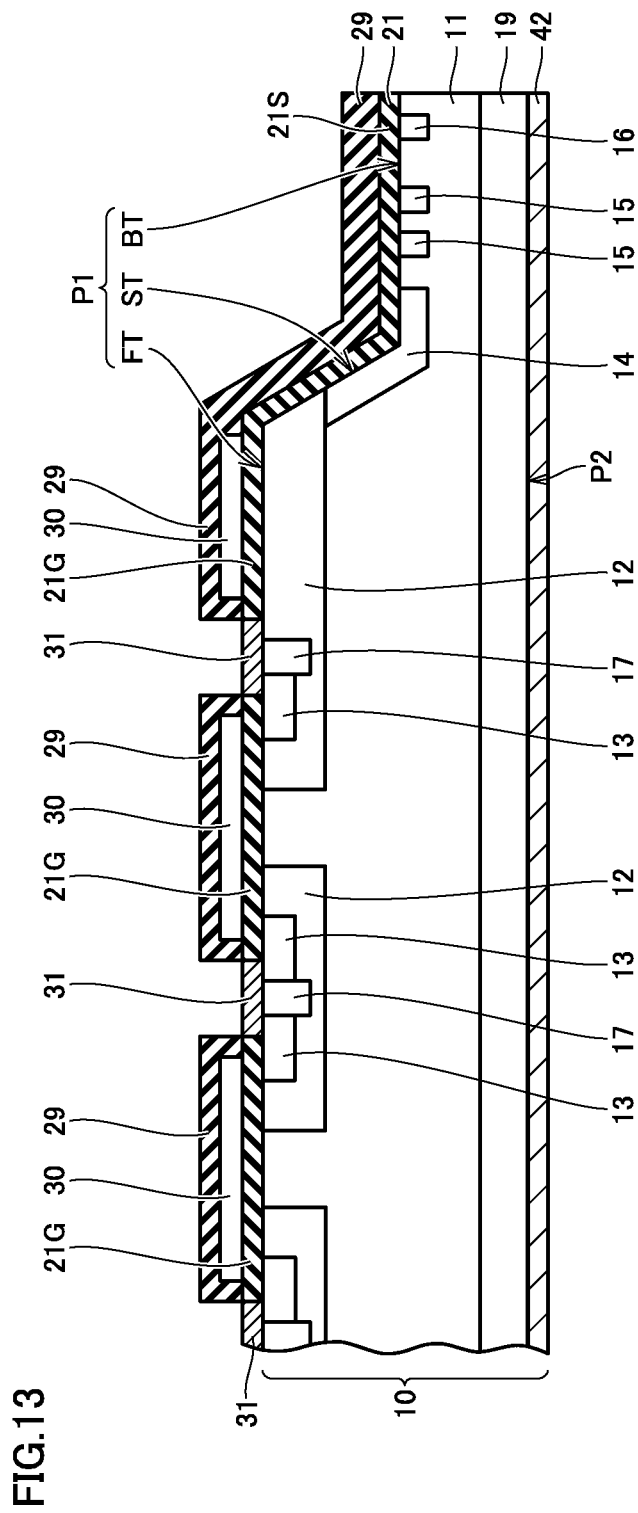
FIG. 13 is a partial cross sectional view schematically showing a ninth step of the method for manufacturing the silicon carbide semiconductor device of FIG. 2.

With reference to FIG. 11, gate electrode 30 is formed on gate insulating film 21G. Next, interlayer insulating film 29 is formed Next, a photoresist layer 73 having a pattern is formed on interlayer insulating film 29. Next, by performing etching using a photoresist layer 73 as a mask, an opening is formed in interlayer insulating film 29 and insulating film 21. Next, source electrode 31 is formed in the opening, and photoresist layer 73 is removed (FIG. 12). In doing so, a so-called lift-off method may be used. Moreover, drain electrode 42 is formed on backside surface P2 of epitaxial substrate 10 (FIG. 13) Each of source electrode 31 and drain electrode 42 is configured as an ohmic electrode resulting from silicidation through heat treatment.

With reference to FIG. 2 again, other configurations are formed, thereby obtaining MOSFET 100.

(Thermal Etching)

The thermal etching is performed by exposing an object, to be etched, to an etching gas under a high temperature, and has substantially no physical etching function. A process gas for the thermal etching contains a halogen element. More preferably, the halogen element is chlorine or fluorine Specifically, an exemplary, usable process gas is a process gas containing at least one of $Cl_2$, $BCl_3$, $CF_4$, and $SF_6$, and $Cl_2$ can be used particularly suitably.

Moreover, the process gas preferably further contains oxygen gas. Further, the process gas may contain a carrier gas Examples of the carrier gas include nitrogen gas, argon gas, or helium gas.

Preferably, the heat treatment temperature of the thermal etching is not less than 700° C. and not more than 1200° C. The lower limit of this temperature is more preferably 800° C., further preferably 900° C. Accordingly, the etching rate can attain a sufficiently practical value. Further, the upper limit of this temperature is more preferably 1100° C., further preferably 1000° C. When the heat treatment temperature is set at not less than 700° C. and not more than 1000° C., a rate of etching SiC is approximately, for example, 70 μm/hr.

(Function and Effect)

According to MOSFET 100 of the present embodiment, side wall surface ST disposed in termination portion TM is inclined by not less than 50° and not more than 80° relative to the {000-1} plane. In this way, the plane orientation of side wall surface ST can become suitable for suppression of interface state between side wall surface ST and side wall insulating film 21S. Accordingly, in termination portion TM, an interface state density in the interface between side wall surface ST of epitaxial substrate 10 and side wall insulating film 21S can be made low. This suppresses generation of electric current resulting from existence of the interface state Therefore, the leakage current of MOSFET 100 can be suppressed. Moreover, side wall surface ST can be readily provided with the "special plane", and the leakage current is suppressed more in this case. Substantially the same applies to side wall surface ST having one of plane orientations of {0-33-8}, {0-11-2}, {0-11-4} and {0-11-1} when viewed macroscopically.

Moreover, JTE region 14 is provided at side wall surface ST of upper surface P1. Accordingly, electric field concentration is relaxed, thereby increasing the breakdown voltage of MOSFET 100.

Moreover, upper surface P1 is provided with bottom surface BT having a smaller inclination relative to flat surface FT than the inclination of the side wall surface relative to flat surface FT. Hence, bottom surface BT can be readily provided with the structure for relaxing the electric field concentration. Specifically, guard ring region 15 is provided at bottom surface BT. Accordingly, the electric field concentration is relaxed, thereby increasing the breakdown voltage of MOSFET 100.

Moreover, side wall surface ST is formed by thermal etching. By using the thermal etching, the plane orientation of side wall surface ST can become suitable for suppression of interface state between side wall surface ST and side wall insulating film 21S. Specifically, a special plane can be formed in side wall surface ST. This suppresses generation of electric current resulting from existence of the interface state. Therefore, the leakage current of MOSFET 100 can be suppressed.

(Special Plane)

Figure 14:
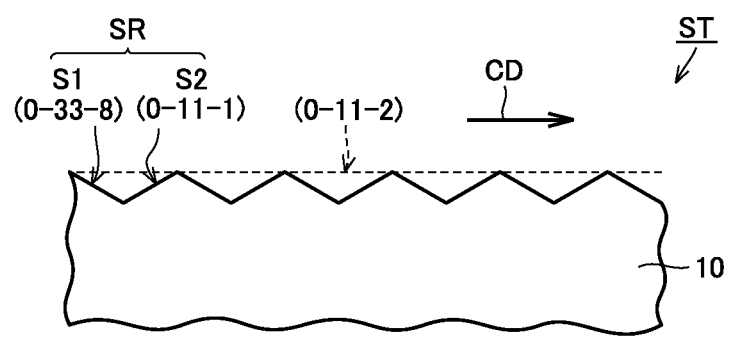
FIG. 14 is a partial cross sectional view schematically showing an example of a fine structure in a side wall surface of the silicon carbide substrate included in the silicon carbide semiconductor device.

Side wall surface ST of upper surface P1 preferably has a special plane Such a side wall surface ST includes a plane S1 (first plane) having a plane orientation of {0-33-8} as shown in FIG. 14. Plane S1 preferably has a plane orientation of (0-33-8).

More preferably, side wall surface ST microscopically includes plane S1 and side wall surface ST microscopically further includes a plane S2 (second plane) having a plane orientation of {0-11-1}. Here, the term "microscopically" refers to "minutely to such an extent that at least the size about twice as large as an interatomic spacing is considered" As a method for observing such a microscopic structure, for example, a TEM (Transmission Electron Microscope) can be used. Plane S2 preferably has a plane orientation of (0-11-1).

Preferably, plane S1 and plane S2 of side wall surface ST form a combined plane SR having a plane orientation of {0-11-2}. That is, combined plane SR is formed of periodically repeated planes S1 and S2. Such a periodic structure can be observed by, for example, a TEM or an AFM (Atomic Force Microscopy). In this case, combined plane SR has an off angle of 62° relative to the {000-1} plane, macroscopically. Here, the term "macroscopically" refers to "disregarding a fine structure having a size of approximately interatomic spacing". For the measurement of such a macroscopic off angle, a method employing general X-ray diffraction can be used, for example.

Preferably, combined plane SR has a plane orientation of (0-11-2). In this case, combined plane SR has an off angle of 62° relative to the (000-1) plane, macroscopically. Preferably, a direction CD in which leakage current flows is along a direction in which the above-described periodic repetition is made. Direction CD corresponds to a direction in which the thickness direction (longitudinal direction in FIG. 2) of epitaxial substrate 10 is projected to side wall surface ST.

Next, a detailed structure of combined plane SR will be illustrated.

Figure 15:
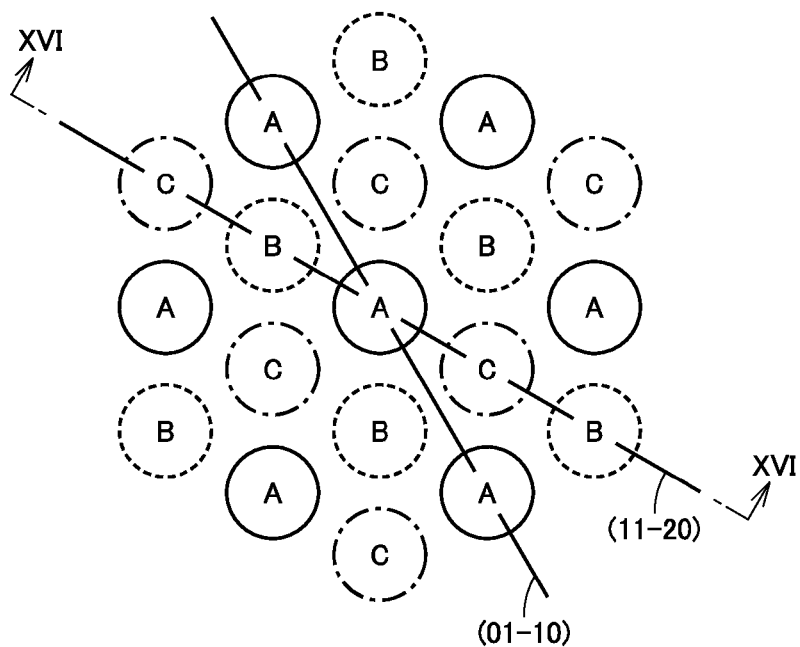
FIG. 15 shows a crystal structure of a (000-1) plane in a hexagonal crystal of polytype 4H.

Generally, regarding Si atoms (or C atoms), when viewing a silicon carbide single crystal of polytype 4H from the (000-1) plane, atoms in a layer A (solid line in the figure), atoms in a layer B (broken line in the figure) disposed therebelow, and atoms in a layer C (chain line in the figure) disposed therebelow, and atoms in a layer B (not shown in the figure) disposed therebelow are repeatedly provided as shown in FIG. 15. In other words, with four layers ABCB being regarded as one period, a periodic stacking structure such as ABCBAB-CBABCB . . . , is provided.

Figure 16:
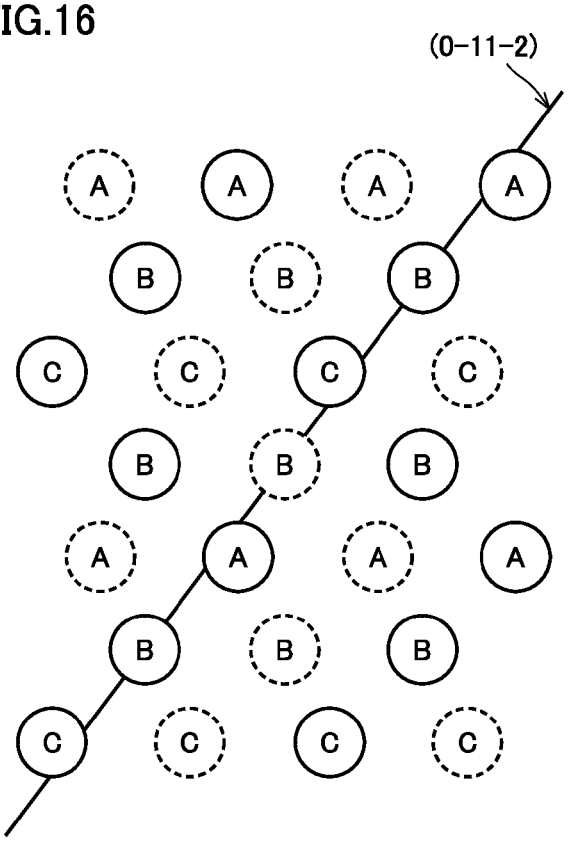
FIG. 16 shows a crystal structure of a (11-20) plane along a line XVI-XVI of FIG. 15.

As shown in FIG. 16, in the (11-20) plane (cross section taken along a line XVI-XVI of FIG. 15), atoms in each of four layers ABCB constituting the above-described one period are not aligned completely along the (0-11-2) plane. In FIG. 16, the (0-11-2) plane is illustrated to pass through the locations of the atoms in layers B. In this case, it is understood that each of atoms in layers A and C is deviated from the (0-11-2) plane Hence, even when the macroscopic plane orientation of the surface of the silicon carbide single crystal, i.e., the plane orientation thereof with its atomic level structure being ignored is limited to (0-11-2), this surface can have various structures microscopically.

Figure 17:
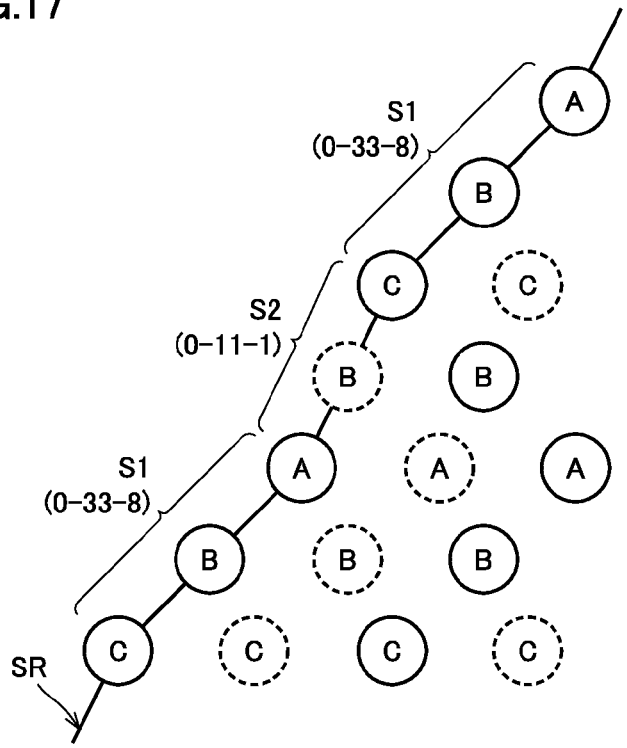
FIG. 17 shows a crystal structure in the vicinity of a surface with a combined plane of FIG. 14 within the (11-20) plane.

As shown in FIG. 17, combined plane SR is constructed by alternately providing planes S1 having a plane orientation of (0-33-8) and planes S2 connected to planes S1 and having a plane orientation different from that of each of planes S1. Each of planes S1 and S2 has a length twice as large as the interatomic spacing of the Si atoms (or C atoms). It should be noted that a plane with plane S1 and plane S2 being averaged corresponds to the (0-11-2) plane (FIG. 16).

Figure 18:
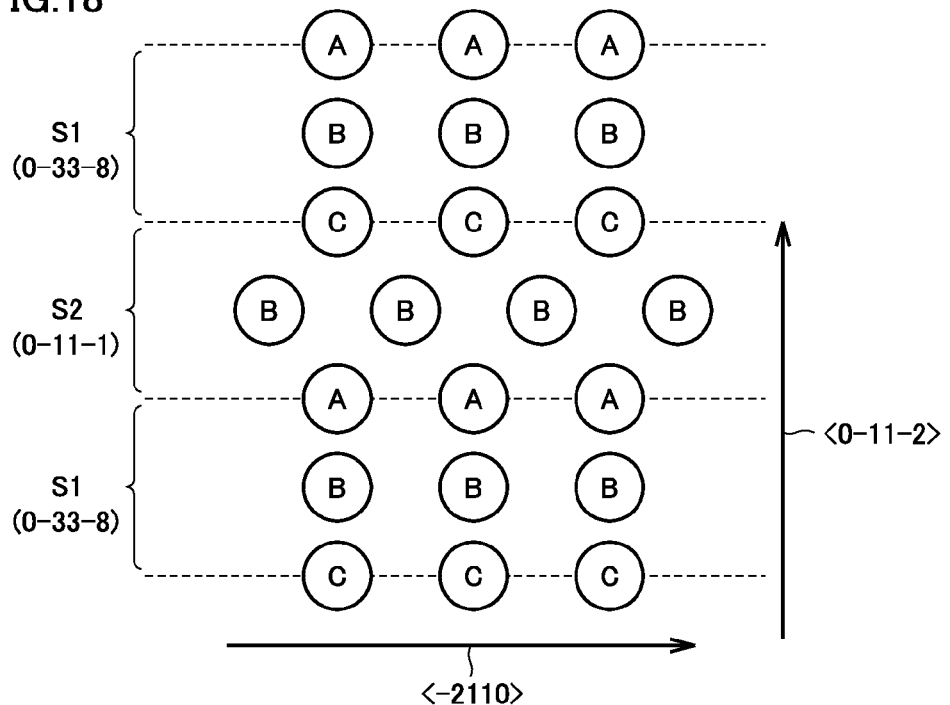
FIG. 18 shows the combined plane of FIG. 14 when viewed from a (01-10) plane.

As shown in FIG. 18, when viewing combined plane SR from the (01-10) plane, the single-crystal structure has a portion periodically including a structure (plane S1 portion) equivalent to a cubic structure. Specifically, combined plane SR is constructed by alternately providing planes S1 having a plane orientation of (001) in the above-described structure equivalent to the cubic structure and planes S2 connected to planes S1 and having a plane orientation different from that of each of planes S1. Also in a polytype other than 4H, the surface can be thus constituted of the planes (planes S1 in FIG. 18) having a plane orientation of (001) in the structure equivalent to the cubic structure and the planes (planes S2 in FIG. 18) connected to the foregoing planes and having a plane orientation different from that of each of the foregoing planes. The polytype may be 6H or 15R, for example.

Figure 19:
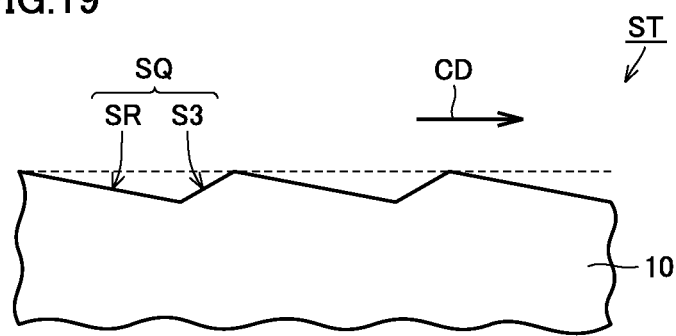
FIG. 19 shows a modification of FIG. 14.

As shown in FIG. 19, side wall surface ST may further include a plane S3 (third plane) in addition to combined plane SR. More specifically, side wall surface ST may include a combined plane SQ constituted of periodically repeated plane S3 and combined plane SR. A periodic structure thereof can be observed by a TEM or an AFM, for example. In this case, the off angle of side wall surface ST relative to the {000-1} plane is deviated from the ideal off angle of combined plane SR, i.e., 62° Preferably, this deviation is small, preferably, in a range of =10°. Examples of a surface included in such an angle range include a surface having a macroscopic plane orientation of {0-33-8}.

More preferably, the off angle of side wall surface ST relative to the (000-1) plane is deviated from the ideal off angle of combined plane SR, i.e., 62°. Preferably, this deviation is small, preferably, in a range of 10°. Examples of a surface included in such an angle range include a surface having a macroscopic plane orientation of (0-33-8).

(Appendix)

The gate insulating film and the side wall insulating film may be formed separately, not simultaneously. The channel type of the silicon carbide semiconductor device may be a p channel type, and in this case, a configuration in which p type and n type were replaced with each other can be employed in the above-described embodiment. The silicon carbide semiconductor device may be a MISFIT (Metal Insulator Semiconductor Field Effect Transistor) other than the MOSFET, and may be a silicon carbide semiconductor device other than the MISFET. An example of the silicon carbide semiconductor device other than the MISFET is an IGBT (Insulated Gate Bipolar Transistor).

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

Reference Signs List

10: epitaxial substrate (silicon carbide substrate); 11: n drift region (first impurity region), 12: p body region (second impurity region); 13: n source region (third impurity region), 14: JTE region (side wall impurity region); 15: guard ring region; 16: field stop region; 17: p contact region; 19: single-crystal substrate, 21: insulating film; 21G: gate insulating film; 21S: side wall insulating film; 29: interlayer insulating film; 30: gate electrode; 31: source electrode (first main electrode); 42: drain electrode (second main electrode); 50: gate runner; 51: interconnection layer; 59: gate pad, 71: mask layer; 72, 73: photoresist layer, 100: MOSFET (silicon carbide semiconductor device), BT: bottom surface; CL: element portion; FT: flat surface; P1: upper surface (first main surface); P2: backside surface (second main surface); S1: plane (first plane); S2: plane (second plane); SQ, SR: combined plane; ST: side wall surface; TM: termination portion.

The invention claimed is:

1. A silicon carbide semiconductor device having an element portion provided with a semiconductor element, and a termination portion surrounding said element portion, the silicon carbide semiconductor device comprising:
   a silicon carbide substrate made of silicon carbide having a hexagonal single-crystal structure, said silicon carbide substrate having a first main surface and a second main surface opposite to said first main surface, said first main surface having a flat surface and a side wall surface, said flat surface being located in said element portion, said side wall surface being located in said termination portion, said side wall surface surrounding said flat surface, said side wall surface being inclined relative to said flat surface so as to come close to said second main surface, said silicon carbide substrate including a first impurity region, a second impurity region, and a third impurity region, said first impurity region having a first conductivity type, said second impurity region being provided on said first impurity region and having a second conductivity type, said third impurity region being provided on said second impurity region and being separated from said first impurity region by said second impurity region, each of said first to third impurity regions having a portion located on said flat surface;
   a gate insulating film connecting said first and third impurity regions to each other on said flat surface of said first main surface;
   a gate electrode provided on said gate insulating film;
   a first main electrode in contact with said third impurity region on said flat surface of said first main surface;
   a second main electrode provided on said second main surface; and
   a side wall insulating film covering said side wall surface of said first main surface, said side wall surface being inclined by not less than 50° and not more than 80° relative to a {000-1} plane.

2. The silicon carbide semiconductor device according to claim 1, wherein said side wall surface of said first main surface of said silicon carbide substrate includes a first plane having a plane orientation of {0-33-8}.

3. The silicon carbide semiconductor device according to claim 2, wherein said side wall surface of said first main surface of said silicon carbide substrate microscopically includes said first plane, and said side wall surface microscopically further includes a second plane having a plane orientation of {0-11-1}.

4. The silicon carbide semiconductor device according to claim 3, wherein said first and second planes of said side wall surface of said first main surface of said silicon carbide substrate form a combined plane having a plane orientation of {0-11-2}.

5. A silicon carbide semiconductor device having an element portion provided with a semiconductor element, and a termination portion surrounding said element portion, the silicon carbide semiconductor device comprising:
   a silicon carbide substrate made of silicon carbide having a hexagonal single-crystal structure, said silicon carbide substrate having a first main surface and a second main surface opposite to said first main surface, said first main surface having a flat surface and a side wall surface, said flat surface being located in said element portion, said side wall surface being located in said termination portion, said side wall surface surrounding said flat surface, said side wall surface being inclined relative to said flat surface so as to come close to said second main surface, said silicon carbide substrate including a first impurity region, a second impurity region, and a third impurity region, said first impurity region having a first conductivity type, said second impurity region being provided on said first impurity region and having a second conductivity type, said third impurity region being provided on said second impurity region and being separated from said first impurity region by said second impurity region, each of said first to third impurity regions having a portion located on said flat surface;
   a gate insulating film connecting said first and third impurity regions to each other on said flat surface of said first main surface;
   a gate electrode provided on said gate insulating film;
   a first main electrode in contact with said third impurity region on said flat surface of said first main surface;
   a second main electrode provided on said second main surface; and
   a side wall insulating film covering said side wall surface of said first main surface, said side wall surface having one of plane orientations of {0-33-8}, {0-11-2}, {0-11-1} and {0-11-1} when viewed macroscopically.

6. The silicon carbide semiconductor device according to claim 1, wherein a side wall impurity region is provided at said side wall surface of said first main surface of said silicon carbide substrate, said side wall impurity region having said second conductivity type and being connected to said third impurity region.

7. The silicon carbide semiconductor device according to claim 1, wherein said first main surface of said silicon carbide substrate has a bottom surface surrounding said side wall surface in said termination portion, and said bottom surface has a smaller inclination relative to said flat surface than an inclination of said side wall surface relative to said flat surface.

8. The silicon carbide semiconductor device according to claim 7, wherein a guard ring region is provided at said bottom surface of said first main surface of said silicon carbide substrate, said guard ring region having said second conductivity type, said guard ring region being separated from said side wall surface, said guard ring region surrounding said side wall surface.

9. A method for manufacturing a silicon carbide semiconductor device having an element portion provided with a semiconductor element, and a termination portion surrounding said element portion, the method comprising the steps of:
   preparing a silicon carbide substrate made of silicon carbide having a hexagonal single-crystal structure, said silicon carbide substrate having a first main surface and a second main surface opposite to said first main surface, said first main surface having a flat surface and a side wall surface, said flat surface being located in said element portion, said side wall surface being located in said termination portion, said side wall surface surrounding said flat surface, said side wall surface being inclined relative to said flat surface so as to come close to said second main surface, said silicon carbide substrate including a first impurity region, a second impurity region, and a third impurity region, said first impurity region having a first conductivity type, said second impurity region being provided on said first impurity region and having a second conductivity type, said third impurity region being provided on said second impurity region and being separated from said first impurity region by said second impurity region, each of said first to third impurity regions having a portion located on said flat surface, the step of preparing said silicon carbide substrate including the step of forming said side wall surface by removing a portion of said first main surface of said silicon carbide substrate through etching by heating said silicon carbide substrate while exposing a portion of said first main surface of said silicon carbide substrate to a gas containing a halogen element;

forming a gate insulating film connecting said first impurity region and said third impurity region to each other on said flat surface of said first main surface;

forming a side wall insulating film covering said side wall surface of said first main surface;

forming a gate electrode on said gate insulating film;

forming a first main electrode in contact with said third impurity region on said flat surface of said first main surface; and forming a second main electrode on said second main surface.

* * * * *

UNITED STATES PATENT AND TRADEMARK OFFICE
CERTIFICATE OF CORRECTION

| | | |
|---|---|---|
| PATENT NO. | : 9,224,802 B2 | Page 1 of 1 |
| APPLICATION NO. | : 14/439612 | |
| DATED | : December 29, 2015 | |
| INVENTOR(S) | : Hiyoshi et al. | |

It is certified that error appears in the above-identified patent and that said Letters Patent is hereby corrected as shown below:

In the Claims:
In claim 5, column 12, line 38, replace "{0-11-1}" with -- {0-11-4} --.

Signed and Sealed this
Twenty-third Day of August, 2016

Michelle K. Lee
*Director of the United States Patent and Trademark Office*